United States Patent
Li

(10) Patent No.: US 8,930,771 B2
(45) Date of Patent: *Jan. 6, 2015

(54) SYSTEMS AND METHODS FOR RETRIEVING DATA

(75) Inventor: Tieniu Li, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 311 days.

This patent is subject to a terminal disclaimer.

(21) Appl. No.: 13/116,407

(22) Filed: May 26, 2011

(65) Prior Publication Data

US 2011/0239061 A1    Sep. 29, 2011

Related U.S. Application Data

(60) Continuation of application No. 12/839,048, filed on Jul. 19, 2010, now Pat. No. 7,954,004, which is a division of application No. 11/759,585, filed on Jun. 7, 2007, now Pat. No. 7,765,426.

(51) Int. Cl.
*G06F 11/00* (2006.01)
*G11C 16/34* (2006.01)
*G06F 11/07* (2006.01)
*G06F 11/10* (2006.01)

(52) U.S. Cl.
CPC ............ *G06F 11/073* (2013.01); *G11C 16/349* (2013.01); *G06F 11/1068* (2013.01); *G06F 11/076* (2013.01)
USPC .......................................................... 714/42

(58) Field of Classification Search
USPC ........... 714/2, 3, 4.3, 4.4, 6.12, 6.13, 6.3, 6.2, 714/6.32, 25, 30, 31, 41, 42, 704, 721, 764, 714/765, 774
See application file for complete search history.

(56) References Cited

U.S. PATENT DOCUMENTS

| 5,898,868 A | 4/1999 | Krueger et al. |
| 5,923,897 A | 7/1999 | Lipe et al. |

(Continued)

FOREIGN PATENT DOCUMENTS

| CN | 1530836 A | 9/2004 |
| CN | 1571069 A | 1/2005 |

(Continued)

OTHER PUBLICATIONS

European Office Action dated Jul. 3, 2012, EP Application No. 11165727.6, 7 pages.

(Continued)

*Primary Examiner* — Nadeem Iqbal
(74) *Attorney, Agent, or Firm* — Knobbe Martens Olson & Bear LLP

(57) ABSTRACT

Apparatus and methods, such as those that read data from non-volatile integrated circuit memory devices, such as NAND flash. For example, disclosed techniques can be embodied in a device driver of an operating system. Errors are tracked during read operations. If sufficient errors are observed during read operations, the block is then retired when it is requested to be erased or a page of the block is to be written. One embodiment is a technique to recover data from uncorrectable errors. For example, a read mode can be changed to a more reliable read mode to attempt to recover data. One embodiment further returns data from the memory device regardless of whether the data was correctable by decoding of error correction code data or not.

20 Claims, 4 Drawing Sheets

(56) References Cited

U.S. PATENT DOCUMENTS

| | | | |
|---|---|---|---|
| 5,963,473 A * | 10/1999 | Norman | 365/185.02 |
| 6,002,612 A | 12/1999 | Noda et al. | |
| 6,046,939 A | 4/2000 | Noda et al. | |
| 6,049,899 A | 4/2000 | Auclair et al. | |
| 6,256,642 B1 | 7/2001 | Krueger et al. | |
| 6,339,546 B1 * | 1/2002 | Katayama et al. | 365/185.09 |
| 6,614,689 B2 | 9/2003 | Roohparvar | |
| 6,948,026 B2 | 9/2005 | Keays | |
| 6,948,041 B2 | 9/2005 | Chevallier et al. | |
| 7,155,589 B2 | 12/2006 | Chevallier et al. | |
| 7,203,874 B2 | 4/2007 | Roohparvar | |
| 7,353,348 B2 | 4/2008 | Baba | |
| 7,370,260 B2 * | 5/2008 | Nahas | 714/763 |
| 7,412,575 B2 | 8/2008 | Park et al. | |
| 7,447,936 B2 | 11/2008 | Shiota et al. | |
| 7,512,847 B2 * | 3/2009 | Bychkov et al. | 714/723 |
| 7,765,426 B2 * | 7/2010 | Li | 714/6.13 |
| 8,037,358 B2 * | 10/2011 | Kuroyanagi | 714/36 |
| 2002/0080650 A1 | 6/2002 | Katayama et al. | |
| 2002/0133760 A1 | 9/2002 | Ahrens et al. | |
| 2003/0043647 A1 | 3/2003 | Kanamori et al. | |
| 2003/0225961 A1 * | 12/2003 | Chow et al. | 711/103 |
| 2005/0144524 A1 * | 6/2005 | Bonaccio et al. | 714/27 |
| 2005/0276119 A1 | 12/2005 | Abedifard et al. | |
| 2006/0039196 A1 | 2/2006 | Gorobets et al. | |
| 2006/0107127 A1 | 5/2006 | Park et al. | |
| 2006/0242484 A1 | 10/2006 | Roohparvar | |
| 2006/0248268 A1 | 11/2006 | Roohparvar | |
| 2007/0038901 A1 | 2/2007 | Shiota et al. | |
| 2007/0047327 A1 | 3/2007 | Goda et al. | |
| 2007/0061612 A1 * | 3/2007 | Henderson et al. | 714/5 |
| 2007/0271494 A1 | 11/2007 | Gorobets | |
| 2008/0008001 A1 * | 1/2008 | Kuroyanagi | 365/185.11 |
| 2009/0055680 A1 | 2/2009 | Honda et al. | |

FOREIGN PATENT DOCUMENTS

| | | |
|---|---|---|
| CN | 1790292 A | 6/2006 |
| JP | 2002-278848 | 9/2002 |
| JP | 2003-76615 | 3/2003 |
| JP | 2003-076615 | 3/2003 |
| JP | 2004-005628 | 1/2004 |
| JP | 2004-259324 | 9/2004 |
| JP | 2005-528696 A | 9/2005 |
| WO | WO 01/022232 A1 | 4/2003 |

OTHER PUBLICATIONS

European Patent Office; Extended European Search Report of related European Application 11165727.6-2224; Jul. 28, 2011; Munich, Germany.
European Patent Office; Extended European Search Report of related European Application 11165755.7-2224; Jul. 27, 2011; Munich, Germany.
China State Intellectual Property Office; Office action of related Chinese Application 200880018929.X; Jul. 13, 2011; Beijing, China.
Memory Technology Device (MTD) Subsystem for Linux; http://www.linux-mtd.infradead.org/doc/namd.html.
Memory Technology Device (MTD) Subsystem for Linux; http://www.linux-mtd.infradead.org/faq/namd.html.
European Patent Office; Communication Pursuant to Article 94(3) EPC for European Application No. 08755737.7-2224; Dated Apr. 7, 2010; Munich, Germany.
The International Bureau of WIPO; International Preliminary Report on Patentability of related PCT Application No. PCT/US2008/063938, filed May 16, 2008; mailing date Dec. 17, 2009; Geneva, Switzerland.
International Searching Authority; "Notification of Transmittal of the International Search Report and the Written Opinion of the International Searching Authority, or the Declaration", "International Search Report", and Written Opinion of the International Searching Authority; Oct. 23, 2008; European Patent Office; Rijswijk; The Netherlands.
International Searching Authority; Invitation to Pay Additional Fees and, Where Applicable, Protest Fee & Communication Relating to the Results of the Partial International Search; Jun. 3, 2008; European Patent Office; Rijswijk; The Netherlands.
Japanese Patent Office; Office Action dated Feb. 5, 2013, from related Japanese patent Application No. JP 2010-511237.
Chinese Patent Office; Office Action dated Jul. 11, 2014, from related application Chinese Patent Application No. 201210298956.5 (filed May 16, 2008).
Notice of Preliminary Rejection (Non-Final) dated Aug. 28, 2014 of corresponding Korean Patent Application No. 10-2010-7000248—6 pages.

* cited by examiner

SYSTEMS AND METHODS FOR RETRIEVING DATA

CROSS-REFERENCE TO RELATED APPLICATION

This application is a continuation application of U.S. application Ser. No. 12/839,048, filed Jul. 19, 2010, issued on May 31, 2011 as U.S. Pat. No. 7,954,004, which is a divisional application of U.S. application Ser. No. 11/759,585, filed Jun. 7, 2007, issued on Jul. 27, 2010 as U.S. Pat. No. 7,765,426, the entireties of which are hereby incorporated by reference herein.

BACKGROUND

1. Field of the Invention

Embodiments of the invention generally relate to integrated circuits. In particular, embodiments relate to software or hardware for memory circuits.

2. Description of the Related Art

Flash memory is a form of erasable and reprogrammable non-volatile integrated circuit memory. In a flash memory, memory cells are arranged in "blocks" for erasure. After a block has been erased, it is ready for programming if desired. NOR flash memory is a type of flash memory that offers access to individual bytes for retrieval of data, but has relatively low density.

NAND flash memory is a type of flash memory that offers relatively high density. The high density is achieved in part by forming columns of cells connected in series. In addition, with NAND flash memory, data is programmed and accessed in relatively large groups of bytes, such as a page of data. For example, a page can correspond to a row or to a portion of a row in an array.

Data is typically written to and read from a NAND flash memory array a "page" of data at a time. For example, a page can have 2,112 bytes of which 2,048 are data bytes and 64 are spare bytes. The spare bytes are typically used for error correction codes (ECC), wear-leveling information, or other overhead data. Error correction codes increase the robustness of the stored data. Typically, a form of block code is used to generate the error correction codes, such as cyclic redundancy check (CRC) checksums, Hamming codes, Reed-Solomon error correction, or the like. These error correction codes detect if there were errors in the reading of the data bytes and can typically correct errors in the data bytes provided that the errors do not exceed the capability of the error correction code.

Flash memory has many uses. Examples include flash memory hard drives (replacements for hard drives), USB flash drives or thumb drives, mobile phones, digital cameras, digital media players, games, memory cards, navigation devices, personal digital assistants, computers, or the like. Within limits, the error correction codes can correct many errors in the data in the data bytes. However, beyond these limits, data with errors cannot typically be corrected. One disadvantage of conventional techniques is that by the time errors become uncorrectable, it is often too late.

Many of the devices that use flash memory for data storage also use an operating system. The operating system serves as an abstraction layer between hardware and other software. For example, a file system and a device driver of the operating system typically provide access to data stored on a memory device. There can be additional layers within an operating system.

FIG. 1 illustrates an example of a portion of a processing environment including a microprocessor in the form of a CPU 102, an operating system 104, and a memory device 106. The memory device 106 can be a NAND flash memory device. The operating system 104 further includes a file system 108 and a device driver 110. It will be understood that the operating system 104 can have support for more than one file system and more than one device driver and other components not relevant to the present discussion. Also illustrated are a volatile memory device 114, such as DRAM, and a direct memory access (DMA) controller 116.

The CPU 102 executes instructions, including the code of the operating system 104. The code of the file system 108 provides abstraction between low-level information, such as logical addresses for the memory device 106, and high-level information, such as a file name and directory. The code for the device driver 110 typically handles low-level information for the data transfer to and from the memory device 106. The device driver 110 can provide code for the CPU 102 to directly access the memory device 106 (known as processors input/output) or can provide code that activates the DMA controller 116 to handle the bus control so that data is transferred to or from the memory device 106. The use of the DMA controller 116 frees up the CPU 102 to handle other tasks.

With both processor input/output (PIO) and DMA input/output, the device driver 110 can handle ECC information associated with write operations and read operations. In many operating systems, many device drivers exist to support reading to and writing from various different types of memory devices. In addition to the mapping by the file system 108, it should be noted that many NAND flash memory devices utilize virtual mapping, which can be referred to as a flash translation layer, between logical addresses and physical addresses for bad block management and wear out management.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Apparatus and methods read data from non-volatile integrated circuit memory devices, such as NAND flash. For example, these techniques can be embodied in a device driver of an operating system. At least a partial history of errors is maintained (e.g., tracked) during read operations. Read operations for a page typically occur much more frequently than erase operations for the corresponding block or programming of the page. The errors encountered and tracked during these read operations can provide an indication of the reliability of the page and block being read.

If sufficient errors are observed during read operations, the block is then indicated (e.g., designated) for retirement. The block can be retired, for example, by adding the block to a bad block table when it is requested to be erased or written (programmed).

One embodiment includes a technique to recover data from uncorrectable errors. For example, a read mode can be changed to a more reliable read mode to attempt to recover data. This read mode can have less aggressive timing. One embodiment further returns data from the memory device regardless of whether or not the data was corrected by decoding of error correction code data. In contrast to hard disk devices, which typically fail catastrophically, an integrated circuit memory device typically has a small number of bit failures, which leaves most of the data usable even when error correction fails.

A device driver for an operating system embodying the disclosed techniques can be embodied in software (in code), in hardware (in modules), or in a combination of software and hardware. In addition, while described in the context of NAND flash memory, the principles and advantages described herein will be applicable to other forms of non-volatile integrated circuits as well. Other embodiments of the invention, including embodiments that do not provide all of the benefits and features set forth herein, will be apparent to those of ordinary skill in the art.

Figure 1:
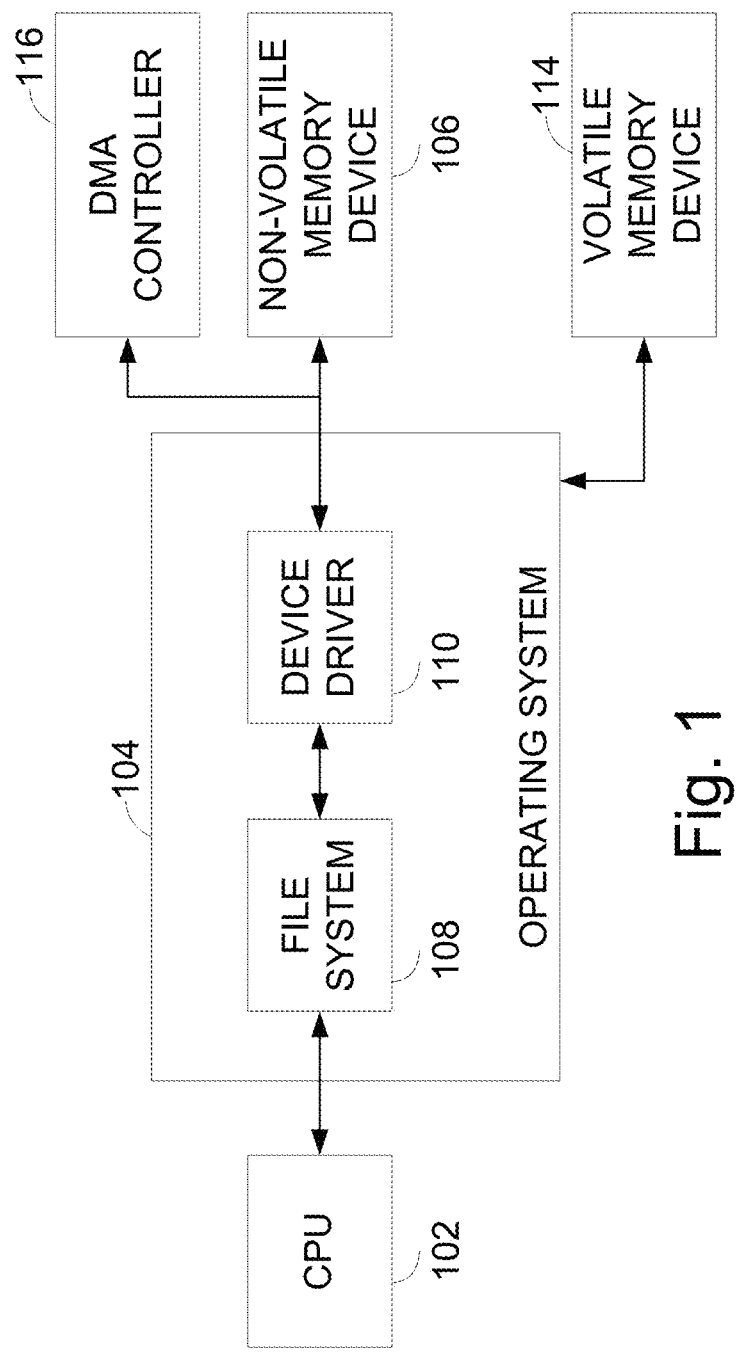
FIG. 1 illustrates a processing environment, including a CPU, an operating system, and a memory device.
Figure 2:
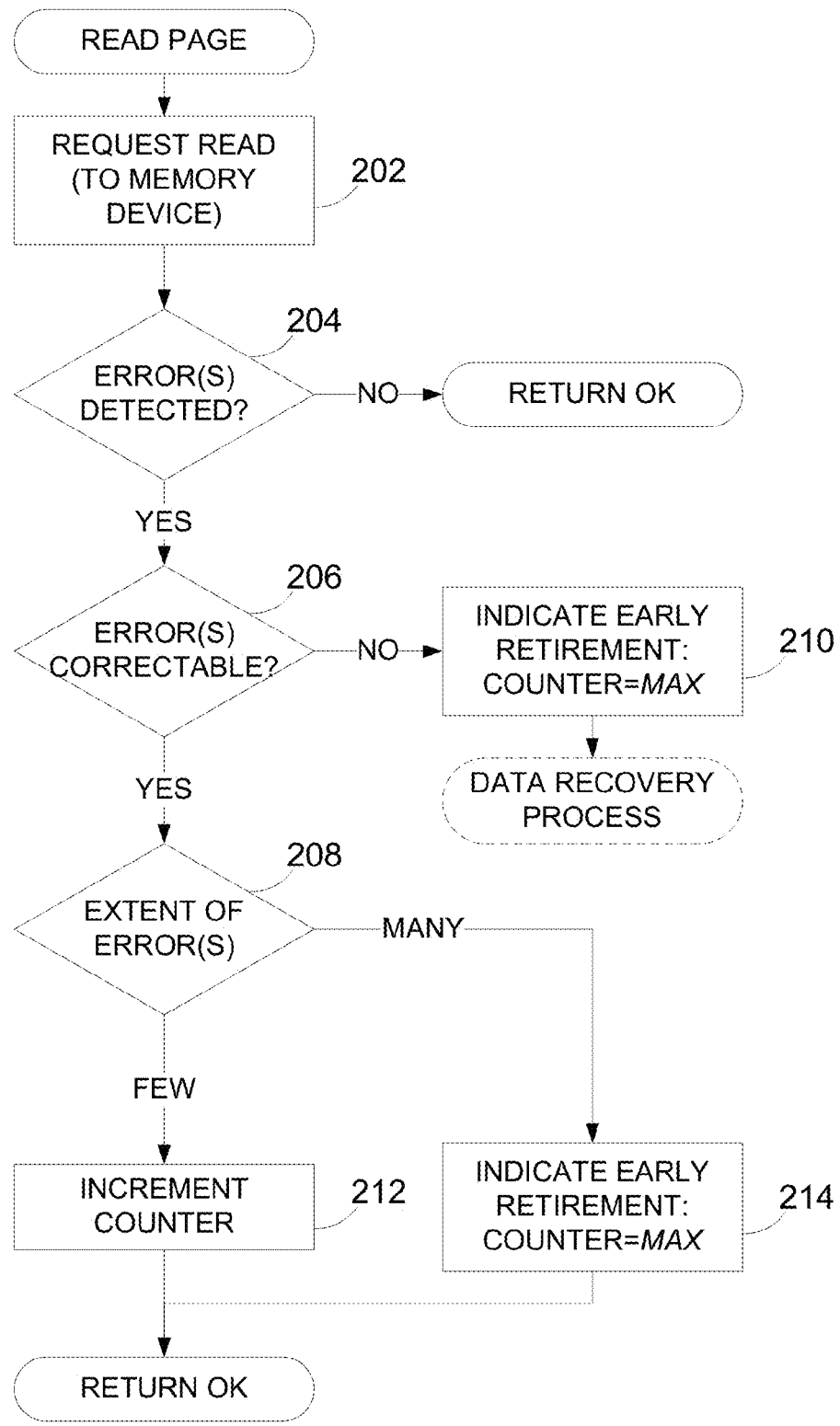
FIG. 2 is a flowchart generally illustrating an embodiment of a process for reading a page of data from a memory device.

FIG. 2 is a flowchart generally illustrating a process for reading a page of data from a memory device 106 (FIG. 1) and maintaining a history of errors. In one embodiment, the process is performed by the device driver 110 (FIG. 1) of an operating system, and the memory device 106 is a NAND flash memory device. It will be appreciated by the skilled practitioner that the illustrated process can be modified in a variety of ways. For example, in another embodiment, various portions of the illustrated process can be combined, can be rearranged in an alternate sequence, can be removed, and the like. At the start of the process, it is assumed that data has already been stored in the memory device along with corresponding error correction code data.

The illustrated embodiment of the process will generally be described in connection with reading a single page of a block of the memory device 106 (FIG. 1). A counter is used to maintain the history of errors for the block. The memory device 106 has many blocks and can have one counter per block for the tracking of errors. In one embodiment, a counter array is used to store the counters. When a counter for a block reaches a particular threshold level, MAX, which can be a predetermined value such as a value of 10, the process determines that the block is to be retired early. For example, the block can be retired when it is to be erased or when a page of the block is to be written as will be described in greater detail later in connection with FIG. 3. Volatile or non-volatile memories can be used to store the counters. For robustness, however, it is typically preferred to store this type of information on a different device than the memory device 106 itself. In one embodiment, the counters are reset to zero upon power up such that the history is reset upon power up. This resetting provides a relatively fast response to a sudden degradation in a block.

The process begins by receiving a request for a read of a particular page of the memory device 106 (FIG. 1). The request can be via a subroutine call from a higher layer of the operating system 104 (FIG. 1) than the device driver 110 (FIG. 1), such as from the file system 108 (FIG. 1). The process requests 202 the particular page using low-level instructions, such as machine code to allow the CPU 102 to communicate with the memory device 106 or instructions for the CPU 102 to instruct the DMA controller 116 to communicate with the memory device 106. The memory device 106 internally accesses the memory array(s) and provides data for the page. The ECC data is decoded to detect whether there were any errors and also to correct errors, should errors exist and be correctable. The decoding of ECC can be a software function or a hardware function. In one embodiment, the encoding and decoding of ECC is a function performed by the device driver 110. In an alternative embodiment, the encoding and decoding of ECC is a function of the DMA controller 116.

The process determines 204 whether or not one or more errors were detected when the page was read. Errors can be correctable or not. If no error was encountered during the error detection process, the process proceeds to exit (without updating a counter for the block corresponding to the page) and returns a status of "OK" to the calling routine of the device driver 110 (FIG. 1), such as a file system 108 (FIG. 1). The requested data is available at an output buffer of the memory device 106 (FIG. 1), at a logical address for a data bus, can be transferred to another location such as to another buffer, or the like.

If the process determines 204 that an error(s) has occurred, the process proceeds to determine 206, whether or not the error(s) is correctable via decoding of the error correction code (ECC) data. If the error(s) is correctable within the limitations of the ECC, the process proceeds to determine 208 the extent to which the error(s) that had been corrected. For example, in one embodiment, the process compares the uncorrected data with the corrected data to obtain a count of the number of error(s). Otherwise, if the errors were too numerous for correction by the error correction code, the process indicates the block for early retirement 210. In one embodiment, the counter is set 210 to the threshold value, MAX, to provide the indication of early retirement. Indicating that a block is to be retired early is not the same as actually retiring the block.

A block can be retired by marking the block as bad, such as by adding the block to a bad block table. The bad block table is typically stored on the memory device 106 (FIG. 1) itself. However, until data from the block is no longer desired, the block should not yet be marked as bad. Marking of the block as bad will prevent read access to the block. Accordingly, in one embodiment, the process waits until an erase operation is requested or a write operation is requested to mark the block as bad, as will be described in greater later in connection with FIG. 3. In one embodiment, the process returns an error to a calling routine, such as a file system 108 (FIG. 1), which then initiates procedures to retire the block.

In one embodiment, the process advances from the indicate early retirement state 210 to a data recovery process to attempt to recover the data. One embodiment of such a data recovery process will be described in greater detail later in connection with FIG. 4. In an alternative embodiment, the process advances from the indicate early retirement state 210 and returns a "read error" status to the calling routine of the device driver, such as the file system 108 (FIG. 1), and exits.

Returning now to the determination 206 of whether the error(s) can be corrected, if the error(s) can be corrected, the process determines 208 the extent to which the ECC corrected the error(s). The number of errors that are considered to be relatively few or relatively many can depend on the page size and the characteristics of the particular memory device 106 (FIG. 1). Appropriate thresholds will be readily determined by one of ordinary skill in the art. In addition, while the illustrated determination 208 is binary, i.e., two possible decisions, it will be understood that one or more intermediate levels can also be used.

In one embodiment, with a 2048-byte page (not including ECC), "few" is considered one correctable error on the page, and "many" is considered two or more correctable errors. In this example, when there is one correctable error on the page, the process proceeds from the determination 208 to an increment counter state 212, and when there is more than one correctable error, the process proceeds from the determination 208 to an indicate early retirement state 214.

In the increment counter state 212, the process increments the counter by a count of 1 for the particular block of the page being read. A counter array can store various counts for the multiple blocks of the memory device 106 (FIG. 1), e.g., one counter per block of the memory device 106. As a block contains many pages, errors from multiple pages can contribute to the count for a particular block. The process then proceeds to return a status of "OK" to the calling routine, e.g., the file system 108 (FIG. 1), of the device driver 110 (FIG. 1) and exits. As will be observed, if the same page or other pages of the block are repeatedly read with error(s), the count stored in the counter for the block will increase. The count stores a history of errors encountered while reading page(s) of the block.

Returning now to the path of the determination 208 used when relatively many errors, e.g., 2 or more, were encountered, in the indicate early retirement state 214, the process updates the counter to designate the block for early retirement. For example, the counter can be set to the threshold level, MAX, as described in connection with the state 210. In the illustrated embodiment, the state 210 and the state 214 each set the counter to the threshold level, MAX, to designate the block for early retirement. In an alternative embodiment, the state 214 adjusts the counter by an increment that is equal to or larger than the increment of the state 212, but potentially smaller than a jump in counter value from the state 210. The process then proceeds to return a status of "OK" to the calling routine, e.g., the file system 108 (FIG. 1), of the device driver 110 (FIG. 1) and exits. The process illustrated in FIG. 2 identifies blocks that are degrading and should be retired. It can be advantageous for reliability purposes to recognize degrading blocks relatively early, such as when data is being read from a block, rather than relatively late, such as when new data is being written to the block.

Figure 3:
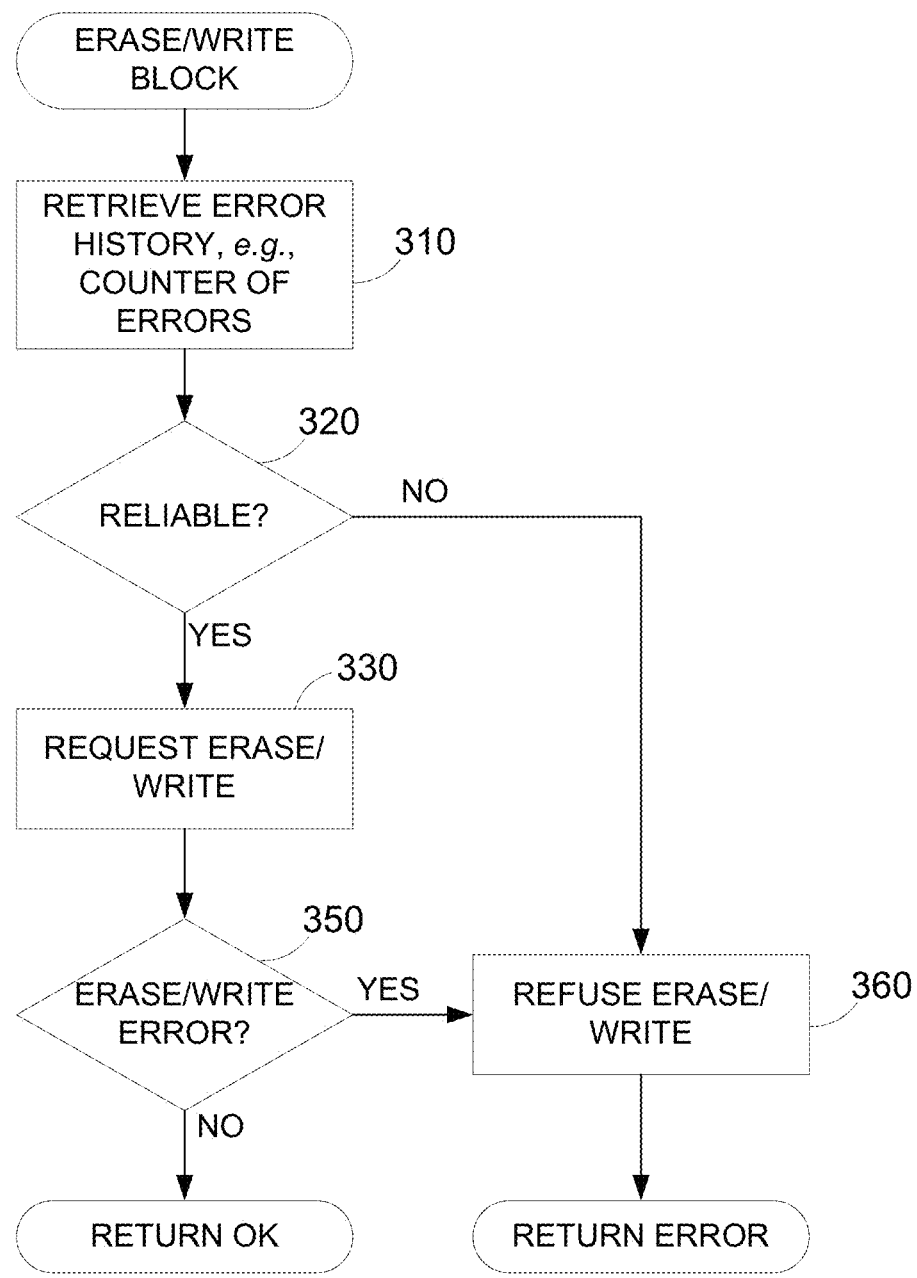
FIG. 3 is a flowchart generally illustrating an embodiment of a process for proactive retirement of a degraded block.

FIG. 3 is a flowchart generally illustrating a process for the proactive retirement of a degraded block. In one embodiment, the process is performed by a device driver of an operating system, and the memory device is a NAND flash memory device. It will be appreciated by the skilled practitioner that the illustrated process can be modified in a variety of ways. For example, in another embodiment, various portions of the illustrated process can be combined, can be rearranged in an alternate sequence, can be removed, or the like. In a NAND flash memory, while reading or writing is performed at the page level, erasing is performed at the block level.

The process is initiated by a request to erase a block from the memory device or by a request to write to a page of a block. For example, the request can come from the file system 108 (FIG. 1) of the operating system 104 (FIG. 1). The request can be in the context of updating data, can be for deleting data, can be for formatting, or the like.

The process retrieves 310 an error history associated with the block to be erased or the corresponding block of the page to be written. For example, the error history can be the count described earlier in connection with FIG. 2.

The process proceeds to determine whether the block is reliable 320. If the block is deemed to be reliable, the process proceeds to instruct the memory device 106 (FIG. 1) to erase 330 the block. The process determines 350 whether or not an error occurred during the erasing process or the writing process within the memory device 106. Assuming that the memory device 106 erases the block or writes to the page without error, the process then exits with a status of "OK" for the calling routine, such as the file system 108 (FIG. 1). If there is an error in the erase or write process, such as stuck bits, then the process can exit with an error status.

If the block is deemed to be unreliable, the process proceeds to refuse 360 the requested erase or write operation and exits with an error status, such as an I/O error. For example, the block can be deemed to be unreliable if the counter is at or above the threshold value for identification of a potentially unreliable block. In response to the error status, a higher layer calling routine such as the file system 108 (FIG. 1) can then reclaim previously written pages, if any, of the block before requesting the device driver 110 (FIG. 1) to mark the block as bad. The previously written pages as well as a current page to be written can be written to a different block. After a block is marked as bad, the block is not usable. In some memory devices, marking a block as bad is accomplished by adding the block to a bad block table in the memory device 106 (FIG. 1). In one embodiment, the addition of the block to the bad block table is also handled by the device driver 110 (FIG. 1) at the request of the file system 108. The early retirement of the block can advantageously permit the block to be retired before the block goes bad. This can help to avoid the future loss of data.

Figure 4:
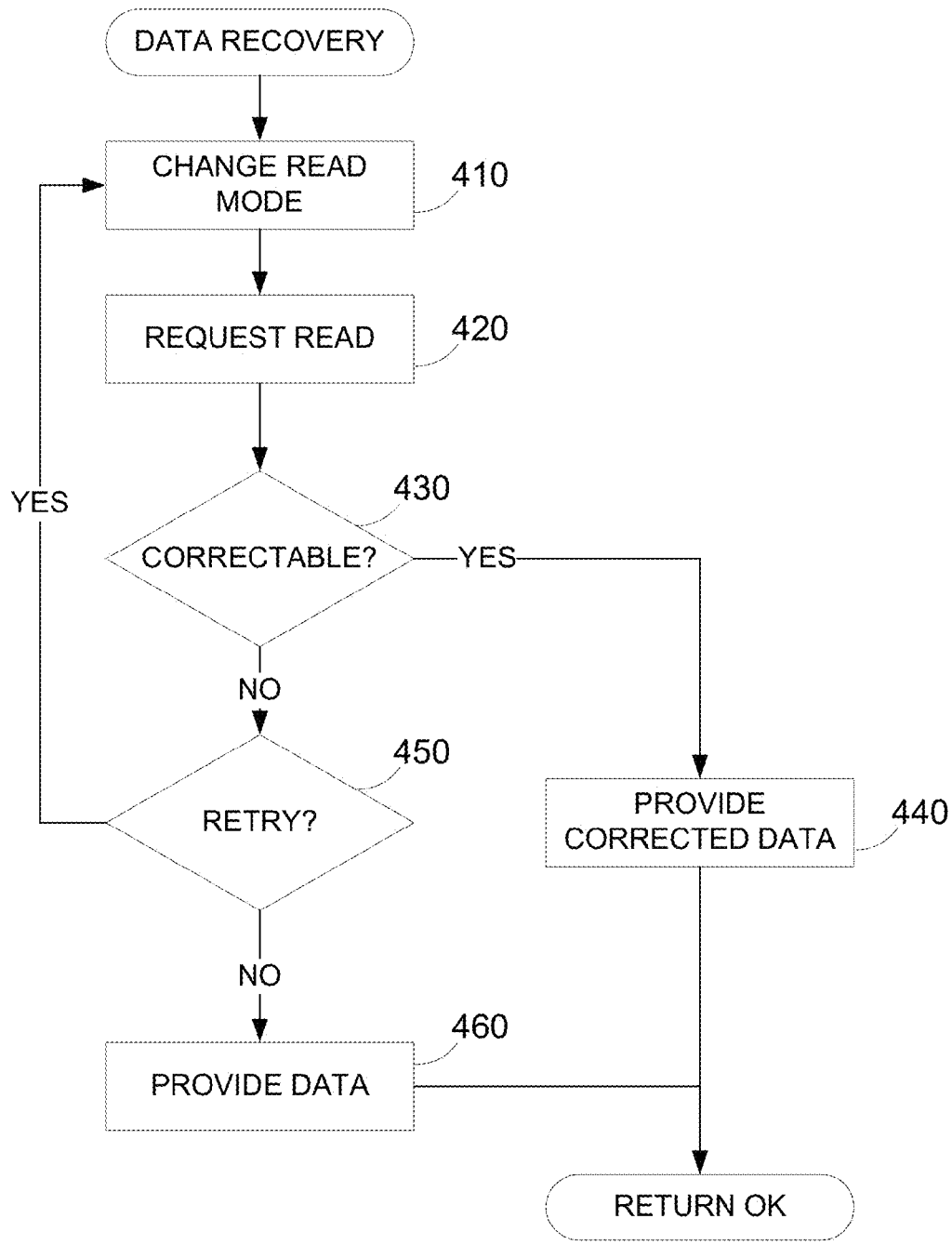
FIG. 4 is a flowchart generally illustrating an embodiment of a process for recovering data determined to have uncorrectable errors.

FIG. 4 is a flowchart generally illustrating a process for recovering data determined to have uncorrectable errors. In one embodiment, the process is performed by a device driver 110 (FIG. 1) of an operating system 104 (FIG. 1), and the memory device 106 (FIG. 1) is a NAND flash memory device. It will be appreciated by the skilled practitioner that the illustrated process can be modified in a variety of ways. For example, in another embodiment, various portions of the illustrated process can be combined, can be rearranged in an alternate sequence, can be removed, and the like.

In one embodiment, the process starts when a data read from the memory device resulted in uncorrectable errors. An uncorrectable error can result when there are too many errors for the error correction codes (ECC) to correct. For example, the process can begin following the indicate early retirement state 210 of FIG. 2.

In the state 410, the process changes a read mode of operation to attempt to read the data in a correctable manner. Most computer systems are configured to access memory devices, such as the memory device 106 (FIG. 1) at the highest compatible speed during normal operation (fast read mode). In one embodiment, the read mode of operation is changed to a reliable read mode. This can include, for example, slower bus speeds, longer latencies, or the like. In another example, the read mode can be changed from a direct memory access (DMA) mode to a mode using the microprocessor to control access, which is also known as processor input/output or PIO. Typically, the DMA mode is preferred because its use frees up the microprocessor to perform other tasks. However, with PIO, the microprocessor can perform a read operation with more control than with DMA. For example, the process can request the temporary disabling of a device that generates noise, such as a speaker of a cell phone. In another example, the process can deliberately slow down timing for the memory device 106. Other techniques will be readily determined by one of ordinary skill in the art. Various features of these techniques can also be combined.

The process proceeds to request a read 420 of the page previously read from the memory device. This read corresponds to a re-read. The error correction code data are also retrieved and reapplied to determine 430 if the data is now correctable. In many circumstances, the data can be correctable after the read using a more reliable mode. If the data is correctable, the process proceeds to provide 440 the corrected data, and the process exits with a status of "OK."

If the data is uncorrectable, the process determines 450 whether to retry or to provide data 460 with errors. The determination 450 to retry or to provide data can be based on, for example, a loop counter, a timer, and the like. The process can return to the state 410 or the read state 420 to re-read data. If the process returns to the state 410, a different (e.g., third, fourth, etc.) read mode can also be tried. For example, if more than one reliable read mode exists, the features of various read modes can be tried separately and/or in combination.

If the data is still not correctable, one embodiment nevertheless provides data 460 with the errors. Unlike hard disk devices, which tend to fail catastrophically, errors in solid-state devices such as NAND flash are often characterized by single-bit failures. While the number of errors will typically be greater than one bit when the page is uncorrectable, the return of data having an error can be better than no return of data. For example, in many instances, the portion of the data with the error will be unnoticeable. For example, if program code is stored in the page, the portion with the error can correspond to a portion of the code that is not always executed. By contrast, when no data is provided, then the entire page's data is not available, in which case, a program nearly always crashes.

One embodiment is a method of monitoring a block of a non-volatile integrated circuit memory device, wherein the method includes: decoding error correction codes to determine whether or not a page of data of the block of the memory device was read with at least one error; and maintaining a history of errors for the block of the memory device corresponding to the page that was read at least when the page was read with at least one error, wherein the history of errors is used to indicate whether or not to retire the block early.

One embodiment is a method of managing blocks for a non-volatile integrated circuit memory device, wherein the method includes: receiving a command to erase a block of memory or write to a page of the block of memory; and disabling an erase or write based at least in part on a history of errors associated with read operations for one or more pages of the block.

One embodiment is a method of accessing a page of data from a non-volatile integrated circuit memory device, wherein the method includes: requesting a read of the page of data from the memory device; inspecting error correction codes (ECC) associated with the page; and providing a status to an operating system that indicates that the page of data was read correctly regardless of whether or not the page of data included any uncorrectable errors.

One embodiment is a method of maintaining one or more indications for indicating that a block of a non-volatile integrated circuit memory device, wherein the method includes preventing further erasing or reprogramming of the block at least partially in response to at least one of: determining that an error detected as part of at least one read operation performed with respect to at least one page of the block of memory is not correctable via decoding of an error correction code; or determining that a history of errors collected for the blocks of the memory device indicates that at least one error has occurred during a prior read operation for the block.

One embodiment is an apparatus for monitoring a block of a non-volatile integrated circuit memory device, wherein the apparatus includes: a module configured to decode error correction codes to determine whether or not a page of data of the block of the memory device was read with at least one error; and a module configured to maintain a history of errors for the block of the memory device corresponding to the page that was read at least when the page was read with at least one error, wherein the history of errors is used to indicate whether or not to retire the block early.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

I claim:

1. A method comprising:
updating a count at least partially in response to determining that an error was detected in a page of data read from a block of memory cells;
resetting the count upon power up of a device that includes the block of memory cells; and
indicating the block for retirement in response to the count reaching a threshold value.

2. The method of claim 1, wherein updating a count comprises incrementing the count.

3. The method of claim 1, further comprising retiring the block when it is to be erased.

4. The method of claim 1, further comprising retiring the block when a page of the block is to be written.

5. A method comprising:
maintaining at least a partial history of errors during read operations for a block of memory cells, wherein maintaining comprises using a counter to maintain the at least a partial history;
providing an indication of the reliability of the block responsive to the at least a partial history; and
resetting the counter upon power up of a device including the block of memory cells.

6. The method of claim 5, wherein providing an indication of the reliability of the block comprises indicating the block for retirement.

7. The method of claim 5, wherein providing an indication of the reliability of the block comprises indicating the block for retirement when the counter reaches a threshold.

8. The method of claim 7, further comprising retiring the block when it is to be erased.

9. The method of claim 7, further comprising retiring the block when a page of the block is to be written.

10. A device driver configured to perform a method comprising:
maintaining at least a partial history of errors during read operations for a block of memory cells, wherein maintaining comprises using a counter to maintain the at least a partial history;
providing an indication of the reliability of the block responsive to the at least a partial history; and
resetting the counter upon power up of a device including the block of memory cells.

11. The device driver of claim 10, wherein the device driver is embodied in software.

12. The device driver of claim 10, wherein the device driver is embodied in hardware.

13. A method of recovering data, the method comprising:
changing a mode of a read of a page of data from a device;
requesting a read of the page of data from the device, wherein the device provides the page of data responsive thereto;

if the page of data provided by the device includes an error, determining whether the page of data provided by the device is correctable; and if the page of data provided by the device is not correctable, changing the mode of the read to a different mode.

14. The method of claim 13, wherein changing a mode of a read of a page of data comprises changing the mode to a more reliable read mode.

15. The method of claim 13, wherein changing a mode of a read of a page of data comprises changing the mode from a direct memory access mode to a mode using a processor to control access.

16. The method of claim 13, wherein changing a mode of a read of a page of data comprises slowing down timing for the device.

17. The method of claim 13, further comprising, if the page of data provided by the device is not correctable, determining whether to provide the data with the error.

18. A device driver configured to perform a method comprising:

changing a mode of a read of a page of data from a device;

requesting a read of the page of data from the device, wherein the device provides the page of data responsive thereto;

if the page of data provided by the device includes an error, determining whether the page of data provided by the device is correctable; and if the page of data provided by the device is not correctable, changing the mode of the read to a different mode.

19. The device driver of claim 18, wherein the device driver is embodied in software.

20. The device driver of claim 18, wherein the device driver is embodied in hardware.

* * * * *